Aug. 13, 1963    J. W. SKERRITT    3,100,848

HIGH SPEED MULTIVIBRATOR HAVING CROSS COUPLING CIRCUITRY

Filed June 25, 1959

INVENTOR
JOHN W. SKERRITT
BY Edgar H. Kent
ATT'Y

United States Patent Office 3,100,848
Patented Aug. 13, 1963

3,100,848
HIGH SPEED MULTIVIBRATOR HAVING CROSS COUPLING CIRCUITRY

John W. Skerritt, Kingston, N.Y., assignor to International Business Machines Corporation, New York, N.Y., a corporation of New York Filed June 25, 1959, Ser. No. 822,793
6 Claims. (Cl. 307—88.5)

Figure 1:
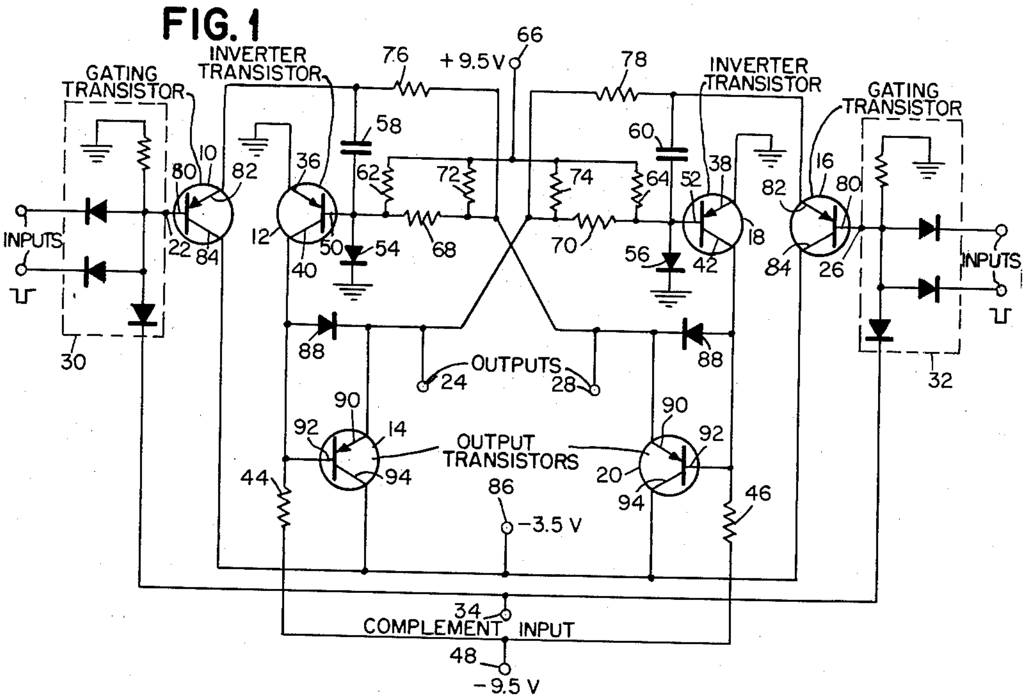

This invention relates to multistate circuits and more particularly to an improved bistable multivibrator circuit capable of reliable operation at extremely high pulse repetition frequencies. This application is a continuation-in-part of my copending application Serial No. 745,886, filed July 1, 1958, now U.S. Patent 3,045,128 granted July 17, 1962.

The problem of increasing the speed of operation of data processing equipment without sacrificing accuracy and reliability is one of immediate and urgent concern in the data processing art. The digital computer, a basic tool in many data handling systems, conventionally employs a plurality of logical circuits, in which the speed capabilities of the slowest operating logical component determines the over-all speed of the system. Suitable logical components for incorporation into many digital data processing machines, in addition to being capable of operating at high speeds in compatibility with other circuit components, must be designed to insure maximum circuit and machine reliability. Among the principal logical components employed in the digital computer is a storage device that has two stable states and the bistable multivibrator or "flip-flop" finds extensive use in digital data handling equipment as such a component.

Accordingly, it is an object of the invention to provide an improved bistable multivibrator circuit suitable for incorporation into digital computer data processing equipment.

Another object of the invention is to provide a reliable bistable multivibrator circuit capable of operating at pulse repetition frequencies substantially in excess of those frequencies of which comparable prior bistable multivibrator circuits have been capable.

Still another object of the invention is to provide an improved high-speed bistable multivibrator suitable for incorporation into small delay digital computer pulse circuitry and which provides maximum driving capability while imposing minimum loading on the associated circuitries.

In the circuitry of the type with which the invention is related, the multivibrator circuit comprises two similar circuits, each having an input terminal and an output terminal and each including an amplifying device. In the stable state one of the amplifying devices is in conducting condition and the other device is in nonconducting condition. A pulse applied to the proper input terminal of the circuit is adapted to change the state thereof. In a high-speed circuit, in addition to having suitable amplifying devices, it is necessary to apply a signal of sufficient amplitude through the appropriate input terminal to the amplifying device as rapidly as possible and at the same time to cause the resultant transition of the amplifying device from one state of conduction to the other and to be coupled to the other circuit to change its state of conduction. Increased speed of operation is obtainable through utilization of overdrive capacitors to couple both the turn-on and turn-off signals to the amplifying devices. However, the conventional arrangement of overdrive capacitors is such as to form a capacitive voltage divider network which reduces the percentage of the input pulse that is applied to the amplifying device, necessitating that the amplitude of the input signal be substantially larger and thus increasing the time required for that input pulse to reach the necessary level for operation of the amplifying device.

In a preferred embodiment of the invention a single overdrive capacitor is utilized to couple both drive-on and drive-off signals to the amplifying device, thereby eliminating the capacitive voltage divider effect and enabling substantially immediate application of substantially the entire amplitude of the input pulse to the amplifying device. This embodiment of the invention has been operated at pulse repetition frequencies in excess of five megacycles per second.

In a second embodiment of the invention, marked additional improvement in the pulse repetition frequency of the circuit is achieved by reducing the time constant in the cross-coupling circuits thereby enabling the more rapid switching of the second amplifying device. This arrangement of the circuit is possible through the utilization of asymmetrically conductive devices which are poled to present a high impedance to input signals as applied to the single overdrive capacitor and thereby mask the low impedance normally present from the output terminal without impairing the improved time constant characteristics of the cross-coupling circuits. This embodiment has been reliably operated at pulse repetition frequencies in excess of thirty five megacycles per second.

Figure 2:
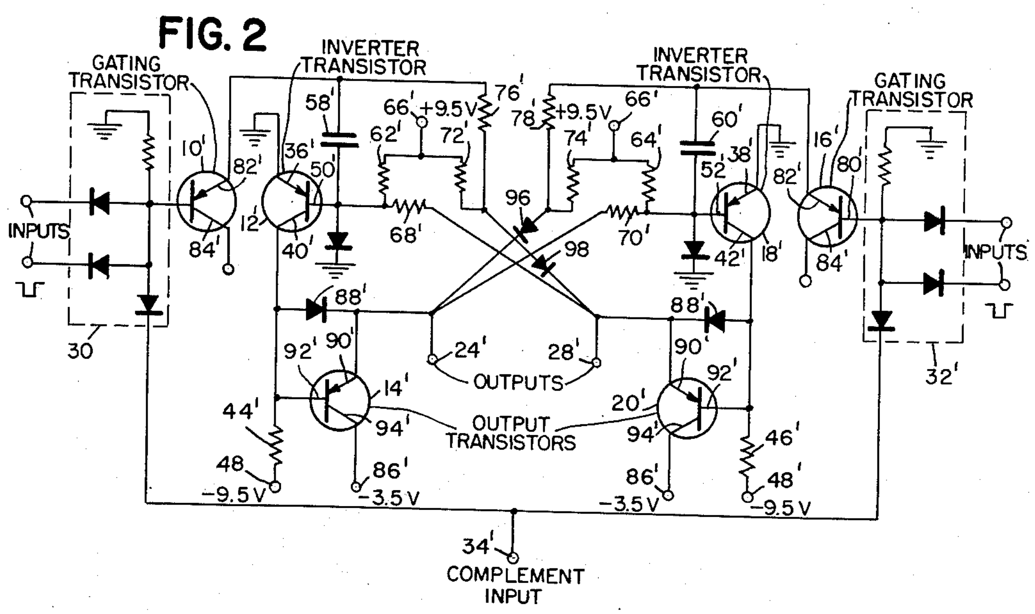

Other objects and advantages of the invention will be seen as the following description of the preferred embodiments of the invention progresses, in conjunction with the drawing in which:

FIG. 1 is a schematic diagram of a bistable multivibrator circuit according to a first embodiment of the invention, and FIG. 2 is a schematic diagram of a bistable multivibrator according to a second embodiment of the invention.

With reference to FIG. 1, the flip-flop or bistable multivibrator circuitry there shown comprises two cross-coupled circuits which include six PNP transistors, 10, 12, 14, 16, 18 and 20, transistors 12 and 18 being connected in grounded emitter configuration and transistors 10, 14, 16 and 20 being connected in common collector configuration. Transistors 10 and 16 are gating transistors for diode capacitor type gate steering, transistors 12 and 18 function as inverter devices and output transistors 14 and 20 afford a low impedance drive to the associated circuitry. The cross-coupled circuit including transistors 10, 12 and 14 will be arbitrarily denominated the binary ZERO side and the circuit including transistors 16, 18 and 20 will be the binary ONE side. Input terminal 22 and output terminal 24 are associated with the ZERO side, and input terminal 26 and output terminal 28 are associated with the ONE side. A conventional diode OR circuit 30, 32 is connected to each input terminal and the two OR circuits are connected to a single complement input 34.

Each of the inverter transistors 12, 18 has its emitter (a current emissive electrode) 36, 38 respectively grounded and its collector (a current receiving electrode) 40, 42 respectively connected through a load resistor 44, 46 to a negative voltage source 9.5 volts in magnitude at terminal 48. The base 50, 52 of each of these transistors is clamped at ground by a diode 54, 56 and a coupling capacitor 58, 60 is adapted to couple drive-on and drive-off signals thereto. A negative transition, nominally the leading edge of a negative going pulse from ground to —3.0 volts, applied to the base of the inverter transistor that is off causes it to switch into conduction. Also connected to each base 50, 52 is a resistor 62, 64, the other terminal of which is connected to a positive voltage source 9.5 volts in magnitude at terminal 66 to supply I*co* to the inverter transistors; and a second resistor 68, 70 which is connected to the output terminal of the opposite circuit in cross-coupling fashion. The resistor 72, 74 connected between terminal 66 and each output terminal provides a current path for the output transistor 14, 20. The resistor 76, 78 connected between each output terminal and the capacitor associated with the opposite circuit provides a path for coupling drive-off signals to the base of each inverter transistor and applies a gating level to the steering network.

The gating transistors 10, 16 which are connected in common collector configuration present a high input impedance and are arranged to couple input signals from the associated OR circuit as applied to its base 80 through its emitter 82 to the associated coupling capacitor. The collectors 84 are connected through terminal 86 to a negative voltage source 3.5 volts in magnitude. The output transistors 14, 20, which are also connected in common collector configuration provide low impedance outputs and substantially reduce the effects of load capacity on the collectors of the inverter stages during turn-off transition and are on at all times except during the period when the associated inverter transistor is turning on. The diodes 88, 88 connected between emitter 90 and base 92 of each output transistor are utilized to insure a voltage difference between emitter and base, thereby enabling conduction of the output transistor. The collectors 94 are connected to terminal 86.

When the left-hand output terminal (ZERO output) is at ground potential the right-hand output terminal (ONE output) is at approximately minus three volts in the steady state and vice versa.

The voltages at the output terminals are changed by the application of a negative-going-signal transition to the base of the inverter transistor that is not conducting through the OR circuit and associated gating transistor. Both gating transistor bases 80 are at ground in the steady state. Assuming that transistor 18 is conducting so that the terminal 28 and the emitter of transistor 10 are at ground potential (so that that transistor functions as a conditioned output) and terminal 24 and the emitter of transistor 16 are at —3.0 volts (so that that transistor functions as a non-conditioned input), a negative going signal applied at the complement input 34 is coupled through the diode OR circuits 30, 32 but forward biases only the emitter-base junction of transistor 10. The input signal, which is approximately 2.5 volts at this point due to insertion loss through the OR circuit and transistor, is coupled through capacitor 58 and drives the transistor 12 into saturation by forward biasing its emitter-base junction, thus permitting current flow in its emitter-collector circuit. A part of this current is passed through the associated diode 88 to charge load capacitance at the output terminal and the voltage at that terminal rises toward ground. At this time the base of the output transistor is positive with respect to its emitter and the transistor becomes cut off. It will be noted that the output transistors are normally conducting and that their bases 92 are negative with respect to their emitters 90. Under these conditions the diodes 88 are reverse biased and they remain reverse biased except during the time that the collector potential of the inverter transistor 12, 18 is rising when either of these transistors is turned on.

The potential on the output terminal 24 rises to ground and is held substantially at that point by the emitter follower action of the output transistor 14. As the voltage level at the output terminal 24 rises towards ground the resultant signal is coupled through resistor 78 and capacitance 60 to the base 52 thus turning the inverter transistor 18 off by removing the forward biasing potential at its emitter-base junction. The diode 56 clips excessive positive voltage overshoot at the base 52 and the transistor 18 is maintained off in the stable state due to the voltage divider action of resistors 70 and 64.

When inverter transistor 18 is switched off, its collector potential and the potential on the base 92 of the output transistor 20 falls, and the resulting signal transition is applied to output terminal 28 by emitter follower action of transistor 20. This transition at the output terminal 28 is a fall to about minus 3.5 volts. This fall in potential is coupled back to the base 50 of transistor 12 through the feedback resistor 68 thus maintaining transistor 12 in conducting condition. Thus the circuits have been switched to the second stable state with transistor 12 conducting and transistor 18 not conducting.

Thus in the embodiment of FIG. 1, a single overdrive capacitor in each cross-coupled stage couples both drive-on and drive-off signals to the inverter transistors. The elimination of a second overdrive capacitor avoids the capacitor voltage divider effect which would reduce the percentage of the input pulse that is applied to the base of the inverter transistor without any impairment in speed of operation. Emitter follower gating transistors are utilized to produce fast switching and present high input impedance to driving circuitry. A low impedance drive at the output level is afforded by the emitter follower output stages. The RC feedback coupling (resistor 76 and capacitor 58 or resistor 78 and capacitor 60) has a sufficiently small time constant to allow the emitters of the gating stages to rise rapidly and to turn off the other inverter transistor so that another input pulse may be applied to the flip-flop. Reliable operation of this circuit at pulse repetition frequencies in excess of five megacycles per second (pulse width of 40 millimicroseconds as viewed on a Tektronix type 545 oscilloscope) has been obtained utilizing components having the following values:

| | | | |
|---|---|---|---|
| Transistors: | | | |
| 10 | | | MAT |
| 12 | | | MADT |
| 14 | | | MADT |
| 16 | | | MAT |
| 18 | | | MADT |
| 20 | | | MADT |
| Diodes (all) | | | T6G |
| Resistors: | | | |
| 44, 46 | | ohms | 620 |
| 62, 64 | | do | 100000 |
| 68, 70 | | do | 1800 |
| 72, 74 | | do | 910 |
| 76, 78 | | do | 150 |
| Capacitors 58, 60 | | micromicrofarads | 220 |

Certain changes may be made in the circuitry, of course, without departing from the invention. For example, a suitable N-P-N transistor may readily be substituted for the PNP transistor utilized in the disclosed embodiment with appropriate changes in the voltage relationships. Other obvious modifications will be evident to those skilled in the art.

An only slightly modified but markedly improved bistable multivibrator circuit is shown in FIG. 2. Similar components have been assigned the same reference numerals with a prime affixed thereto. The circuitry is the same as that of FIG. 1 with the exception of the following changes principally in the emitter circuits of the gating transistors 10′, 16′. The values of the overdrive capacitors 58′, 60′ are lowered to 150 micromicrofarads each, and the values of the feedback resistors 76′, 78′ are lowered to 62 ohms each. Control devices having asymmetric characteristics in the form of type T6G diodes 96, 98 were placed between the output terminals and the network junctions to the feedback resistors. These comparatively minor changes enable a substantial increase in the operating speed of the circuit and it has been operated at a pulse repetition frequency of fifty megacycles per second. The reduction in the values of capacitors 58′, 60′ and feedback resistors 76′, 78′ lower the RC time constant in the emitter circuitry of the pull-over transistors, thereby allowing faster rise times at these points. The use of the diodes 96, 98 allow a larger percentage of the input pulse transition to be applied to the bases of the inverter transistors 12′, 18′.

In operation, assume that the left (ZERO) side is on, the potential at terminal 24′ thus being ground. A negative going signal, applied via the emitter 82′ of transistor 16′, does not see the low impedance through resistor 78′ and the diode 88′ of the transistor 12′ in saturation but rather sees the high impedance provided by the diode 96 which becomes reverse biased during the negative transition of the emitter of transistor 16′. When inverter transistor 18′ is turned on the potential at the output terminal 28′ starts rising toward ground and the clamp provided by diode 98 is released, permitting the emitter of transistor 10′ to start rising toward +9.5 volts under the influence of the electrical potential applied to the network of resistors 72′ and 76′ connected to terminal 66′. Capacitor 58′ couples this rise to the base 50′ of the inverter transistor 12′, thereby rapidly turning off that transistor and causing the output at terminal 24′ to fall. The flip-flop is now in its opposite stable state. As indicated above this circuit has responded to successive complementing pulses spaced at 20 millimicrosecond intervals (50 megacycle PRF).

While there have been shown and described herein preferred embodiments of the invention it will be understood that the invention is not intended to be limited thereto or to details thereof and departures may be made therefrom within the spirit and scope of the invention as defined in the claims.

I claim:

1. A high-speed bistable multivibrator comprising two similar circuits each including an input terminal, an output terminal and an amplifying device having a substantially conducting condition and a substantially nonconducting condition, said multivibrator having two stable states with one of said devices being in conducting condition in one of said stable states and the second device being in conducting condition in the other of said stable states, means for applying an input signal to one of said input terminals for switching said multivibrator from one stable state to the other and cross-coupling means connected between the input terminal of each circuit and the output terminal of the other circuit, each said cross-coupling means including a signal source connected to said input terminal so that a junction is defined therebetween, a control device having asymmetric characteristics connected between the coupled output terminal and said junction for applying a clamp signal as a function of the signal at the coupled output terminal to said junction, said control device isolating the effect of the coupled output terminal from said input signal when that signal is being applied to the coupled input terminal for changing the conducting condition of the associated amplifying device but permitting a resulting signal transition at the coupled output terminal to produce a corresponding signal transition at said junction for changing the conducting condition of the associated amplifying device.

2. A bistable multivibrator comprising a pair of similar cross-coupled circuits, each circuit having an input terminal and an output terminal, each circuit including an amplifying device having a substantially conducting state and a substantially nonconducting state, said amplifying device having an output circuit and an input circuit adapted to control current flow in said output circuit, means including a coupling capacitor connected to each of said input circuits for coupling control signals thereto, means to selectively apply an input signal through one of said input terminals and the associated coupling capacitor, to change the state of the associated device and the signal condition at the associated output terminal, cross-coupling means for coupling signal transitions from the output terminal of each circuit through the capacitor associated with the other circuit for switching the device associated with that circuit to the opposite conducting state, the cross-coupling means associated with each circuit including a voltage source, a network connected between said source and said input terminal, said network including a pair of resistances connected in series and having a junction between said resistances, an asymmetrically conductive device connected between the coupled output terminal and said junction for applying a clamp voltage as a function of the voltage at the output terminal to said junction, said asymmetrically conductive device being poled to isolate the effect of the coupled output terminal on the input signal when that signal is being applied to the coupled input terminal for changing the conducting state of the associated amplifying device but permitting a resulting signal transition at the coupled output terminal to produce a corresponding signal transition at said junction for changing the conducting state of the associated amplifying device, and means for maintaining said circuits in stable switched condition until the application of another input signal.

3. A bistable multivibrator which comprises a pair of similar circuits each having an input terminal and an output terminal and an amplifying device having a substantially conducting state and a substantially nonconducting state, each of said amplifying devices having a current emissive electrode, a current receiving electrode and a control electrode for controlling current passing between said current emissive and said current receiving electrodes, a first source of direct potential connected between the current emissive and current receiving electrodes of said amplifying devices, means including a coupling capacitor connected to said control electrode of each one of said amplifying devices for coupling control signals to said control electrode, means to selectively apply an input signal to one of said coupling capacitors for changing the conducting state of the associated amplifying device, and cross-coupling means connected between the input terminal of each circuit and the output terminal of the other circuit, each said cross-coupling means including a second source of direct potential, a network connected between said second source and said input terminal, said network including a pair of resistances connected in series and having a junction between said resistances, an asymmetrically conductive device connected between the coupled output terminal and said junction for applying a clamp voltage as a function of the voltage at the output terminal to said junction, said asymmetrically conductive device being poled to isolate the effect of the coupled output terminal on the input signal when that signal is being applied to the coupled input terminal for changing the conducting condition of the associated amplifying device but permitting a resulting signal transition at the coupled output terminal to produce a corresponding signal transition at said junction for changing the conducting state of that circuit.

4. A bistable multivibrator comprising two cross-coupled circuits, each circuit having an input terminal and an output terminal and including an amplifying device, said multivibrator being arranged so that one amplifying device is conducting when the other amplifying device is not conducting except during periods of transition between conducting states, each amplifying device having an input circuit and an output circuit, a capacitor connected between each input terminal and the input circuit of the associated amplifying device, said capacitor being adapted to couple turn-on and turn-off signals to said amplifying device, feedback means coupled between the output terminal of one circuit and the capacitor associated with the other circuit, each said feedback means including a signal source connected to said input terminal so that a junction is defined therebetween, an asymmetrically conductive device arranged to present a high impedance to an amplifying device turn-on signal applied at an input terminal, said asymmetrically conductive device being connected between the coupled output terminal and said junction for applying a clamp signal as a function of the signal at the coupled output terminal to said junction, and input signal applying means adapted to apply a turn-on signal to the amplifying device that is not conducting to turn that amplifying device on so that a resulting signal transition at the coupled output terminal is applied via said asymmetrically conductive device to said junction and thereby changes the conducting states of the multivibrator circuits.

5. A bistable multivibrator comprising two cross-coupled circuits, each circuit having an input terminal and an output terminal and including a gating transistor connected in common collector configuration, an inverter transistor connected in grounded emitter configuration and an output transistor connected in common collector configuration, each transistor being of the PNP type and having an input circuit and an output circuit, said multivibrator being arranged so that one inverter transistor is conducting when the other inverter transistor is not conducting except during periods of transition between conducting states, the input terminal of each circuit being connected to the input circuit of the associated gating transistor and the output termial of each circuit being connected to the output circuit of the associated output transistor, a capacitor connected between the output circuit of each said gating transistor and the input circuit of the associated inverter transistor for coupling turn-on and turn-off signals to the inverter transistor, the output circuit of each said inverter transistor being connected to the input circuit of the associated output transistor, feedback means coupled between the output terminal of one circuit and the capacitor associated with the other circuit, each said feedback means including a source of positive potential, an electrical network connected between said source and said capacitor, said network including two resistances connected in series and defining a junction between said two resistances, a diode connected between the coupled output terminal and said network junction for applying a clamp voltage as a function of the voltage at the coupled output terminal to said network junction, said diode being poled to be forward biased under D.C. conditions but presenting a high impedance to an inverter transistor turn-on signal coupled through said gating transistor to the coupled capacitor while permitting a positive-going signal transition at the coupled output terminal to be coupled to said network junction and produce a corresponding turn-off signal transition, and input signal applying means adapted to apply a negative going turn-on signal to the inverter transistor that is not conducting to turn that transistor on and thereby change the conducting states of the multivibrator circuits.

6. A high speed bistable multivibrator capable of operating at pulse repetition frequencies in excess of ten megacycles per second comprising a pair of cross-coupled circuits, each said circuit having an input terminal and an output terminal and including an input pulse gating transistor connected in common collector configuration, an inverter transistor connected in grounded emitter configuration and an output transistor connected in common collector configuration, each transistor having an input circuit and an output circuit, said multivibrator being arranged so that one inverter transistor is conducting when the other inverter transistor is not conducting except during periods of transition between conducting states, the input terminal of each circuit being connected to the input circuit of the associated gating transistor and the output terminal of each circuit being connected to the output circuit of the associated output transistor, a capacitor connected between the output circuit of each said gating transistor and the input circuit of the associated inverter transistor, for coupling turn-on signals to the inverter transistor, the output circuit of each said inverter transistor being connected to the input circuit of the associated output transistor, feedback means coupled between the output terminal of one circuit and the junction between the output circuit of the gating transistor and the capacitor associated with the other circuit arranged to apply a reverse biasing level to the output circuit of said gating transistor and to apply a turn-off signal through said capacitor to the associated inverter transistor, each said feedback means including a voltage source, a network connected between said source and said capacitor so that a junction is defined therebetween, a diode connected between the coupled output terminal and said network junction for applying a clamp voltage as a function of the voltage at the coupled output terminal to said network junction, said diode being poled to be forward biased under D.C. conditions but presenting a high impedance to an inverter transistor turn-on signal coupled through said gating transistor to the coupled capacitor while permitting a signal transition at the coupled output terminal to be coupled to said network junction and produce a corresponding turn-off signal transition, said circuits being arranged so that a turn-on signal applied to the inverter transistor that is not conducting turns that transistor on and thereby changes the conducting states of the multivibrator circuits.

References Cited in the file of this patent

UNITED STATES PATENTS

| | | |
|---|---|---|
| 2,787,712 | Priebe et al. | Apr. 2, 1957 |
| 2,831,986 | Sumner | Apr. 22, 1958 |
| 2,840,728 | Haugk et al. | June 24, 1958 |
| 2,888,579 | Wanlass | May 26, 1959 |
| 2,906,894 | Harris | Sept. 29, 1959 |
| 2,924,725 | Blair | Feb. 9, 1960 |
| 2,946,898 | Jensen | July 26, 1960 |